United States Patent [19]

Craig et al.

[11] Patent Number: 5,270,972
[45] Date of Patent: Dec. 14, 1993

[54] THREE TERMINAL SERIAL-COMMUNICATING PERIPHERAL DEVICE

[75] Inventors: Gary M. Craig; Clifford A. Zitlaw, both of San Jose, Calif.

[73] Assignee: Xicor, Inc., Milpitas, Calif.

[21] Appl. No.: 868,559

[22] Filed: Apr. 14, 1992

[51] Int. Cl.$^5$ ............................................. G11C 13/00
[52] U.S. Cl. ........................ 365/189.03; 365/189.07; 365/226
[58] Field of Search ................... 365/226, 189.03, 233, 365/189.07; 307/303

[56] References Cited

U.S. PATENT DOCUMENTS

| | | | |
|---|---|---|---|
| 4,326,134 | 4/1982 | Owen et al. | 307/268 |
| 4,393,481 | 7/1983 | Owen et al. | 365/228 |
| 4,654,829 | 3/1987 | Jiang et al. | 365/189.03 X |
| 4,902,917 | 2/1993 | Simpson | 365/189.03 X |
| 4,970,692 | 11/1990 | Ali et al. | 365/189.03 X |

FOREIGN PATENT DOCUMENTS

| | | | |
|---|---|---|---|
| 0437129 | 7/1991 | European Pat. Off. | 365/226 |
| 404258893 | 9/1992 | Japan | 365/226 |

OTHER PUBLICATIONS

Technical data sheet for the "Xicor X24C01 Electrically Erasable PROM" published Aug. 1990, disclose an exemplary serial memory device referred to in the specification on p. 13, lines 30-31.

Preliminary data sheet for "Dallas Semiconductor EconoRAM," Dallas Semiconductor Corporation, publication date currently unknown.

*Primary Examiner*—Eugene R. LaRoche
*Assistant Examiner*—Son Dinh
*Attorney, Agent, or Firm*—McCubbrey, Bartels, Meyer & Ward

[57] ABSTRACT

A three-terminal serial-communication peripheral device for low-cost applications is described. The peripheral device comprises a first terminal for receiving a modulated power signal including a source of power and a clocking signal, a second terminal for receiving a reference potential such as a ground reference, and a third terminal for communicating data to and from the peripheral device. The peripheral device further comprises a digital subsystem which exchanges data with an application system. The exchanged data may be stored and retrieved by the digital subsystem, as when the subsystem is a memory unit, or the data may be in the form of measurement data which the peripheral device is supplying to the application system, the measured data being supplied by a sensor of the subsystem. With its three terminals, the peripheral device can communicate data to and from the application system. Because of the low number of required terminals, the peripheral device according to the present invention can be packaged in a low-cost package, thereby significantly reducing its overall cost. The peripheral device further comprises separation/detection circuitry for separating the clocking signal and the source of power on the first terminal. The separation/detection circuit converts the clocking signal into a clock signal having full logic levels suitable for digital logic operation, which is then coupled to the digital subsystem. The clocking signal may take the form of either voltage pulses or current pulses. In a preferred embodiment, the digital subsystem comprises a memory unit and the peripheral device serves as a memory device.

18 Claims, 3 Drawing Sheets

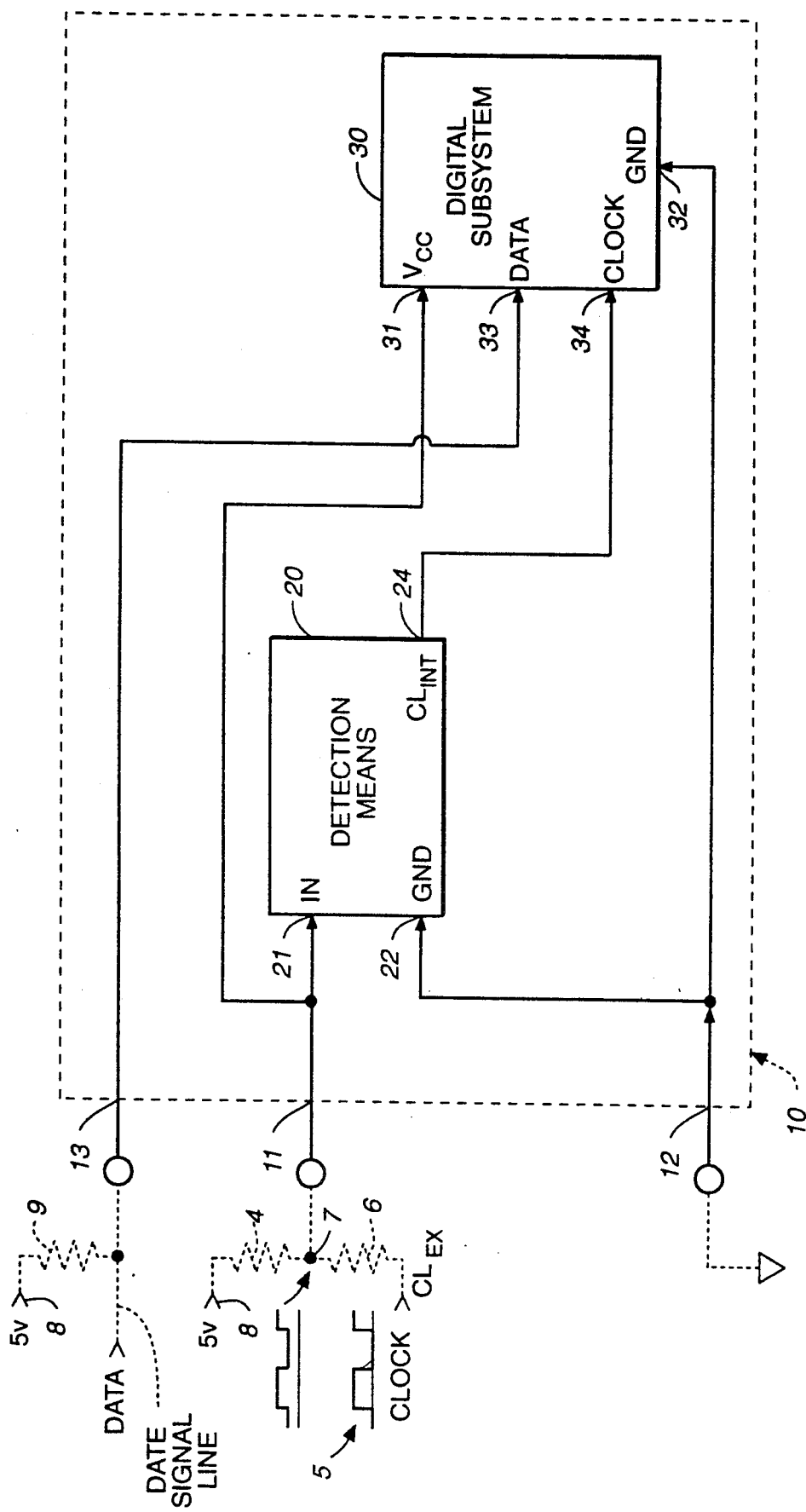
FIG._1

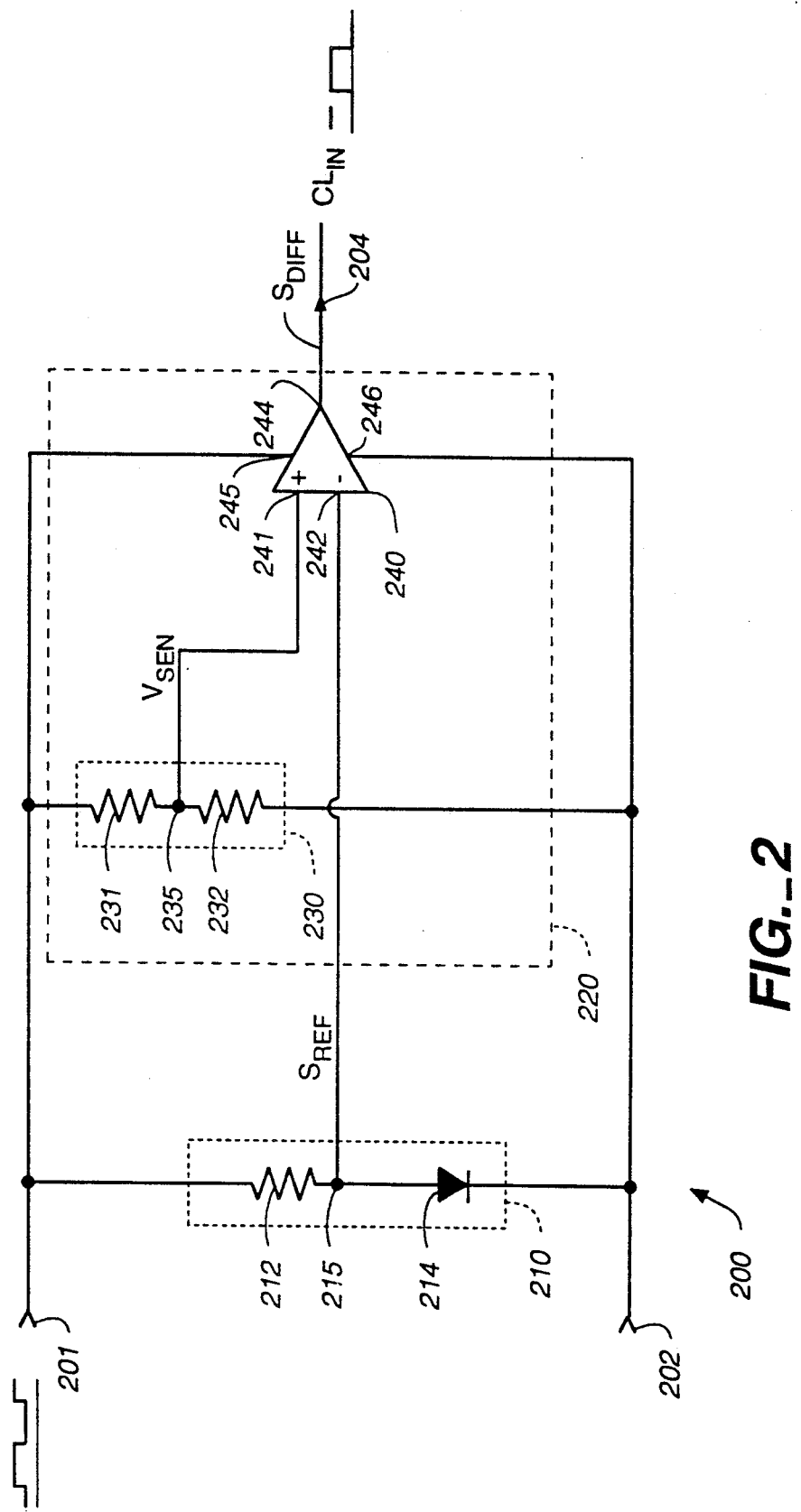
FIG._2

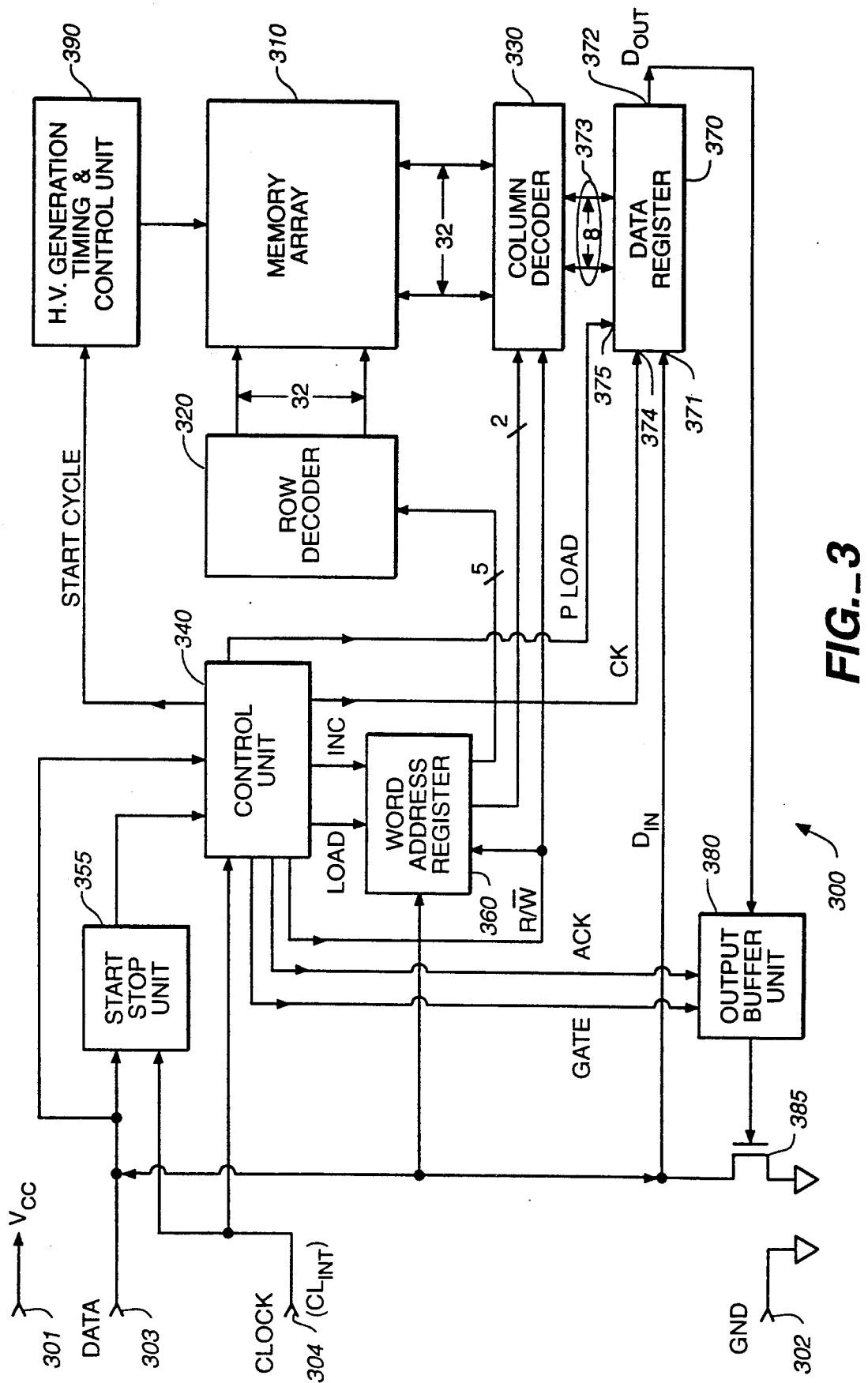
FIG._3

THREE TERMINAL SERIAL-COMMUNICATING PERIPHERAL DEVICE

FIELD OF THE INVENTION

The present invention relates to peripheral devices for digital processing systems employing serial data-communication protocols therewith. In particular, the present invention relates to memory devices for digital processing systems which employ serial data communication protocols in communicating with the memory device.

BACKGROUND OF THE INVENTION

There are currently a number of serial memory devices on the market for low cost memory applications. These serial memory devices are generally of two types: non-volatile memory devices and volatile memory devices, the latter often being referred to as serial 'static RAM' memories. The serial non-volatile memory devices are often used in household appliances to 'remember' the last configuration of the appliance before the appliance is turned off so that the configuration can easily be recalled upon power up of the appliance. The serial 'static RAM' memory devices are often used in applications requiring low-cost temporary storage of digital data, such as for digital computations.

The serial memory devices currently available for sale have a minimum of four terminals: a first terminal for receiving a source of power, a second terminal for receiving a ground reference, a third terminal for communicating data in serial form to and from the memory, using a serial communication protocol, and a fourth terminal for receiving an industry standard clock signal (e.g., a logic low state of zero volts and a logic high state of five volts) to synchronize the data on the third terminal. There are, to date, a number of serial communication protocols available for enabling serial data transfers in integrated circuit devices, e.g., the Serial Peripheral Interface ("SPI") and the "I²C" Bus protocol.

Over the last decade, the advances in semiconductor manufacturing have significantly reduced the cost of manufacturing memory and other digital devices. The reduction in cost has progressed to the point where the cost of packaging a memory device in an industry standard 4-pin or 8-pin dual-inline package (DIP) now often exceeds the cost of manufacturing the integrated circuit. Unfortunately, the manufacturing of the DIP packages and the packaging of integrated circuits therein are mature processes and significant reductions in cost for these processes are not expected in the foreseeable future.

Thus, there is a great economical need to reduce the packaging costs of these serial memory devices. The present invention is directed towards filling this need. The present invention further recognizes that this need may exist for other serial peripheral devices, such as remote sensors, programmable elements (e.g., programmable variable resistors), and various controller means (e.g., variable positioners). The present invention is also directed towards the need for reducing the packaging costs of these peripheral devices as well.

SUMMARY OF THE INVENTION

The present invention recognizes that the cost of packaging of the above-mentioned serial peripheral devices could be dramatically reduced if standard 3-lead terminal packages could be used in place of the commonly used 4-pin and 8-pin packages. The present invention also recognizes that many serial peripheral devices comprise four terminals: a power terminal, a ground reference terminal, a clock terminal and a data terminal. The present invention further recognizes that the functions provided by the power and clock terminals could be provided by a single terminal accepting a combined power and clock signal, thereby reducing the number of required terminals for such serial peripheral devices to three. Accordingly, the present invention provides means for allowing a serial peripheral device such as a memory device, which uses any of the standard serial communication protocols for serial data transfer, to be packaged in a three-lead package.

Broadly stated, the invention encompasses a three terminal peripheral device for use in an application system. The present invention comprises a first terminal for receiving a modulated power signal including a source of power and a first clock signal, a second terminal for receiving a fixed reference potential, preferably ground, and a third terminal for receiving a serial data signal from the application system and/or for transmitting a serial data signal to the application system. The first clock signal has a first logic state, a second logic state, and state transitions between its first and second logic states. The peripheral device is powered by the potential difference between the first terminal and the second terminal. The present invention further comprises a detection means coupled to the first terminal for generating from the modulated power signal a second clock signal at an output of the detection means. The second clock signal has a first logic state, a second logic state and state transitions between its first and second logic states. The state transitions of the second clock signal are a function of the state transitions of the first clock signal. The present invention further comprises a digital subsystem having a power port coupled to the first terminal for receiving a source of power, a ground port coupled to the second terminal for coupling a fixed reference potential, a data port coupled to the third terminal for receiving a serial data signal from the application system and/or for transmitting a serial data signal to the application system, and a clock port coupled to the first output of the detection means for receiving the second clock signal. The data signal and the first clock signal are synchronized with respect to one another such that data in serial form is enabled to be communicated between the digital subsystem of the present invention and the application system.

The digital subsystem of the present invention may further comprise one or more of the following elements, depending upon the capabilities of the peripheral device: a memory unit, as when the peripheral device provides data storage capabilities; a sensing unit, as when the peripheral device provides a sensing capability; a programmable element, as when the peripheral device provides a variable programmable element (such as a resistor) for controlling an electrical quantity; and a controller means (such as a mechanical positioner), as when the peripheral device provides capabilities for controlling a physical object.

Accordingly, it is an object of the present invention to provide a peripheral device which can be operated and powered using just three terminals.

It is a further object of the present invention to provide a peripheral device which can be economically packaged and, thereby, provide a low cost device.

It is yet a further object of the present invention to provide a memory device which can be operated and powered using just three terminals.

It is still a further object of the present invention to provide a memory device which can be economically packaged and, thereby, provide a low cost memory device.

It is yet a further object of the present invention to provide a peripheral device in a three-terminal package while at the same time providing standard digital logic levels for the clock signal used internally to the peripheral device.

These and other objects of the present invention will become apparent to those skilled in the art from the following detailed description of the invention and from the accompanying drawings.

BRIEF DESCRIPTION OF THE DRAWINGS

FIG. 1 is a block diagram of a peripheral device according to the present invention.

FIG. 2 is a block diagram of a detection means according to the present invention.

FIG. 3 is a block diagram of an exemplary digital subsystem according to the present invention, the digital subsystem comprising an exemplary memory unit according to the present invention.

DETAILED DESCRIPTION OF THE INVENTION

A block diagram of a serial data communication peripheral device according to the present invention is shown at 10 in FIG. 1. Peripheral device 10 is intended to be used, or interfaced, with an application system, such as a microprocessor controlled digital processing system used in an appliance device or the like. The essential features of the application system and its interface to the present invention are shown in FIG. 1 by way of reference numbers 4-9 and are discussed below in greater detail. For interfacing with the application system, peripheral device 10 comprises a first terminal 11 for receiving a modulated power signal including a source of power and a first clock signal $CL_{EX}$ (external clock signal), a second terminal 12 for receiving a fixed reference potential, preferably ground, and a third terminal 13 for coupling a serial data signal between the peripheral device 10 according to the present invention and the application system. Preferably, third terminal 13 is for receiving a serial data signal from the application system and/or for transmitting a serial data signal to the application system. In a preferred embodiment, serial data is both received and transmitted from third terminal 13 such that the data path between third terminal 13 and the application system is bi-directional. As discussed below in greater detail, the present invention is powered by the potential difference between first terminal 11 and second terminal 12 and data is communicated between peripheral device 10 and the application system by the first clock signal $CL_{EX}$ present on terminal 11 and the data signal present on terminal 13.

The first clock signal $CL_{EX}$ on terminal 11 can be in a first logic state or a second logic state, with periodic state transitions occurring between said first and second logic states. Likewise, the serial data signal on terminal 13 can be in a first logic state or a second logic state, with periodic state transitions occurring between said first and second logic states. The logic states and transitions of the first clock signal $CL_{EX}$ and the data signal are synchronized to one another by either the external application system or peripheral device 10 such that data in serial form is enabled to be communicated between peripheral device 10 and the application system (i.e., to communicate data to and from device 10). For example, the external application system synchronizes the first clock signal $CL_{EX}$ and the data signal when data is being written to peripheral device 10, and peripheral device 10 synchronizes these signals when data is being read from peripheral device 10. Such a synchronization comprises a serial-data communication protocol, of which many exist, as indicated above.

Additionally, the logic states and state transitions of the first clock signal $CL_{EX}$ and the data signal may be sequenced with respect to one another to represent control commands and data. For example, transitions in the data signal while the clock signal is in one of its two states may be used to transmit a control command to peripheral device 10 while a stable logic state in the data signal while the clock signal is in one of its two states may be used to communicate data to peripheral device 10. In a similar manner, the peripheral device 10 may return pulses on the data signal line at predetermined times to communication data back to the application system. When data is communicated from peripheral device 10 to the application system, the application system maintains the operation of the first clock signal $CL_{EX}$ while peripheral device 10 controls the logic states and transitions in the data signal on terminal 13.

In a preferred embodiment of the present invention, the data signal line coupled to third terminal 13 is coupled to a voltage source 8 via a resistor 9. (The data signal line and resistor 9 are shown in phantom to distinguish them from the present invention.) Normally, resistor 9 maintains the data signal line in a logic high state. Data is communicated across the data signal line by "grounding" or "pulling-down" the potential of data signal line in synchronization with clock signal $CL_{EX}$. As discussed below in greater detail, either the application system or peripheral device 10 may ground the data signal line, depending upon the direction of the communication (i.e., write or read).

In the preferred embodiment of the present invention, the modulated power signal on first terminal 11 comprises a first power-level state and a second power-level state, with the power signal alternating between these two states. The first and second power-level states correspond to the first and second logic states of the first clock signal $CL_{EX}$, respectively. Further, the power provided by the modulated power signal at terminal 11 is preferably sufficient to power peripheral device 10 at all times.

In one preferred embodiment of the present invention, the modulated power signal on first terminal 11 is provided by the application system in the form of voltage-level modulation. In other words, a first voltage level is used for the first power-level state and a second voltage level is used for the second power-level state. Exemplary first and second voltage levels are approximately 3.5 V and 5 V, respectively. Another such exemplary set of first and second voltage levels is approximately 3.0 V and 5 V, respectively.

The application system may provide the exemplary modulation voltage levels of 3.5 V and 5 V by the use of various conventional circuits such as the one shown in FIG. 1, which comprises two resistors 4 and 6, a node 7, a clock signal 5, and a voltage supply 8. (This circuit is shown in phantom to distinguish it from the present invention.) Resistor 4 is coupled between the 5 volt voltage supply 8 and node 7 and resistor 6 is coupled between node 7 and the $CL_{EX}$ clock signal 5. The modulated power signal is provided at node 7, which is coupled to first terminal 11 of the present invention. The system clock signal ($CL_{EX}$) at 5 is modulated between two voltage levels of approximately 0 V and approximately 5 V, respectively. The resistance values of resistors 4 and 6 are chosen with respect to the current consumption of peripheral device 10 (at 3.5 V) such that the voltage at node 7 alternates between approximately 3.5 V and approximately 5 V. Exemplary resistance values at a current consumption of approximately 1 mA (at 3.5 V) are 47 ohms for resistor 4 and 120 ohms for resistor 6.

As well as providing the modulated power signal in the form of modulated voltage levels, the modulated power signal on first terminal 11 may be provided by the application system in the form of current-level modulation. For example, a first current level of approximately 1.0 mA at 3.5 V may represent one power-level state and a second current level of approximately 4.0 mA at 3.5 V may represent the other power-level state. Thus, it may be appreciated that the present invention is not specifically limited to voltage modulation implementations.

In this manner, both power and a clocking signal are communicated to peripheral device 10 on first terminal 11 and, as a consequence, only three terminals are required by peripheral device 10 to receive power and to communicate with the application system. However, due to the design of conventional digital circuits, it may not be preferable to directly use the modulated power signal for clocking the digital subsystem of device 10, which may comprise a semiconductor memory unit. Specifically, in the case that modulated voltage levels of 3.5 V and 5.0 V are used, the voltage levels of 3.5 V and 5 V are not suitable as first and second logic levels for a digital clock signal. More suitable (and conventional) first and second logic levels are approximately 0 V and approximately 5 V, respectively. In the case of modulated current levels on first terminal 11, conventional digital circuits generally prefer and use voltage-based clock signals. (This is because a clock signal in digital system is intended to be distributed to a large but unspecified number of inputs, which a voltage-based clock signal can readily do without necessarily having a priori knowledge of the number of input ports to which the clock signal is being coupled. A current-based clock, however, would necessarily require such a priori knowledge, as each input port would necessarily consume a predetermined amount of detection current.) In the case of modulated current levels on first terminal 11, therefore, the modulated current signal could not be directly used as a conventional digital clock circuit and would require a conversion to a voltage-based clock signal. Thus, it may then be appreciated that a further object of the present invention is to receive a combined clock and power signal in the form of a modulated power signal at first terminal 11 so that a three-terminal package may be used, while at the same time providing standard digital logic levels for the clock signal used internally to peripheral device 10.

To convert the clocking signal at first terminal 11 to a clock signal having more suitable logic levels, peripheral device 10 further comprises a detection means 20 coupled to first terminal 11 for generating from the modulated power signal a second clock signal $CL_{INT}$ (internal clock signal). Detection means 20 comprises a first input port 21 coupled to first terminal 11 for sensing the modulated power signal, a second input port 22 coupled to second terminal 12 for receiving a fixed reference potential, preferably ground, and a first output port 24 for providing second clock signal $CL_{INT}$. Clock signal $CL_{INT}$ comprises first logic state, a second logic state, and state transitions between its first and second logic states. The state transitions of second clock signal $CL_{INT}$ are a function of the state transitions of first clock signal $CL_{EX}$. In a preferred embodiment of the present invention, second clock signal $CL_{INT}$ enters its first logic state substantially when the first clock signal $CL_{EX}$ enters its first logic state and enters its second logic state substantially when first clock signal $CL_{EX}$ enters its second logic state. Thus, second clock signal $CL_{INT}$ is synchronized with the data signal on third terminal 13 such that data in serial form is enabled to be communicated between peripheral device 10 and the application system.

The first and second logic states of the second clock signal $CL_{INT}$ are preferably chosen to be more suitable for use with conventional digital logic and memory circuits. In the preferred embodiment of the present invention, the first and second logic states of second clock signal $CL_{INT}$ are represented by voltages of approximately 0 V and of greater than approximately 3 V, respectively, which are considered to be standard 5 V-MOS logic levels as well as standard TTL logic levels.

Peripheral device 10 further comprises a digital subsystem 30 having a power port 31 coupled to first terminal 11 for receiving a source of power, a ground port 32 coupled to second terminal 12 for receiving a fixed reference potential, a data port 33 coupled to third terminal 13 for receiving a serial data signal from the application system and/or for transmitting a serial data signal to the application system, and a clock port 34 coupled to output 24 of detection means 20 for receiving the second clock signal $CL_{INT}$. In a preferred embodiment of the present invention, serial data is received from the application system by data port 33 and transmitted to the application system by data port 33 such that the data path between data port 33 and the application system is bi-directional. It may be appreciated that detection means 20 and the coupling of power from first terminal 11 to power port 31 collectively comprise means for separating the combined power and clock signal coupled to first terminal 11, for coupling power to power port 31 of subsystem 30, and for coupling a digital clock signal to clock port 34 of subsystem 30.

Digital subsystem 30 further comprises a serial data communication means for decoding the synchronization of logic states and transitions of the signals on data port 33 and clock port 34 into data signals useable by digital subsystem 30. The serial data communication means also provides means for encoding selected data into serial data on data port 33 to be transmitted as a function of the clock signal at clock port 34. The serial data communication means preferably includes a serial register where the serial data may be "collected" together in the form of a predetermined number of bits, such as for example, nibbles, bytes, and words. This facilitates the communication of data between the application system and peripheral device 10 at a "high level"

where instructions and data may be represented by nibbles, bytes, or words. Such a serial register and related communications protocols are discussed below in greater detail with reference to an exemplary embodiment of subsystem 30 shown in FIG. 3. In a preferred embodiment of digital subsystem 30, the serial data signal at data port 33 (third terminal 13) is synchronized to first clock signal $CL_{EX}$ by the application system when serial data is being received from the application system by digital subsystem 30. Also in the preferred embodiment, the serial data signal at data port 33 is synchronized to second clock signal $CL_{INT}$ by digital subsystem 30 when serial data is being transmitted to the application system by digital subsystem 30.

A general description for the operation of peripheral device 10 according to the present invention has thus far been given. The discussion that follows focuses on describing exemplary embodiments of detection means 20 and of digital subsystem 30.

An exemplary embodiment of detection means 20 suitable for detecting voltage-level modulation on first terminal 11 is shown at 200 in FIG. 2. Detection means 200 comprises a first input port 201 for receiving a modulated power signal, a second input port 202 for receiving a fixed reference potential (e.g., ground), and a first output port 204 for providing an internal clocking signal, such as $CL_{INT}$. Ports 201, 202, and 204 of detection means 200 correspond in function to ports 21, 22, and 24 of detection means 20, respectively. As such, port 201 is coupled to first terminal 11 of peripheral device 10 (shown in FIG. 1), port 202 is coupled to second terminal 12 (shown in FIG. 1), and output port 204 is coupled to the clock port 34 of digital subsystem 30 (shown in FIG. 1). As described below in greater detail, detection means 200 is responsive to the modulated power signal present on its port 201 and generates an internal clock signal ($CL_{INT}$) having full logic levels suitable for standard MOS digital logic and memory circuits.

Detection means 200 further comprises a reference means 210 for generating a reference signal $S_{REF}$ from the power being provided between ports 201 and 202. In a preferred embodiment of the present invention, reference signal $S_{REF}$ is obtained, or derived, from the signal at port 201. Detection means 200 further comprises a comparison means 220 for generating the second clock signal $CL_{INT}$ as a function of the variation in the signal at port 201 with respect to the reference signal $S_{REF}$. In a preferred embodiment of detection means 200, reference signal $S_{REF}$ is a substantially constant voltage and the signal at port 201 is a modulated voltage which may vary between a low state of 3.5 V and a high state of 5.0 V. In a preferred embodiment, second clock signal $CL_{INT}$ is output as a logic high signal ($> \sim 3$ V) when the signal at port 201 is in its high state with respect to the reference signal $S_{REF}$, and is output as a logic low signal ($\sim 0$ V) when the signal at port 201 is in its low state with respect to the reference signal $S_{REF}$. In this manner, the state transitions of second clock signal $CL_{INT}$ are a function of the state transitions of first clock signal $CL_{EXT}$.

One exemplary way of generating second clock signal $CL_{INT}$ as a function of the state transitions of first clock signal $CL_{EXT}$ is to compare the voltage at port 201 against a voltage for the reference signal $S_{REF}$ which is between the low state voltage (e.g., 3.5 V) and the high state voltage (e.g., 5.0 V) of the signal at port 201. For example, the reference signal $S_{REF}$ generated by reference means 210 may have a value of 4.25 V, which is mid-way between 3.5 V and 5.0 V. Such a voltage may, for example, be derived from port 201 by a voltage-averaging circuit having a rectifier, a capacitor, and a resistor. (Such an averaging circuit may constrain the duty-cycle of the signal at port 201 to be within a specific range, as for example a range of 45% to 55%.) In this example, second clock signal $CL_{INT}$ is output from detection means 200 as a logic high signal ($> \sim 3$ V) when the signal at port 201 is greater than the 4.25 V reference signal $S_{REF}$ (i.e., when the difference between the signal at port 201 and the reference signal is a positive value), and is output as a logic low signal ($\sim 0$ V) when the signal at port 201 is less than the 4.25 V reference signal $S_{REF}$ (i.e., when the difference between the signal at port 201 and the reference signal is a negative value). In this example, a differential amplifier is used to compare the signal at port 201 against the 4.25 V reference signal $S_{REF}$. In this manner, second clock signal $CL_{INT}$ is generated as a function of the difference of the signal at port 201 and the reference signal $S_{REF}$ and the state transitions of second clock signal $CL_{INT}$ are a function of the state transitions of first clock signal $CL_{EXT}$.

In a preferred embodiment of detection means 200, second clock signal $CL_{INT}$ is generated as follows. A lower substantially constant voltage value of approximately 0.7 V is used for the reference signal $S_{REF}$ and is generated from the voltage between ports 201 and 202. The variations in the voltage of the signal at port 201 is also converted to a lower, more "workable" voltage value range, preferably having a low state of $\sim 0.575$ V and a high state of $\sim 0.825$ V in this embodiment. The converted varying voltage at port 201 is shown at $V_{SEN}$ in FIG. 2. Also in this preferred embodiment, the $\sim 0.7$ V reference signal $S_{REF}$ and the converted signal $V_{sen}$ are compared by a differential amplifier in comparison means 220, which is powered by the potential difference across ports 201 and 202. The above conversion of the reference signal $S_{REF}$ and the varying signal at port 201 brings these signals to voltage levels below the voltage needed to power the differential amplifier, which is typically 3.5 V to 5 V. This allows for a simple and reliable design for the differential amplifier. In addition, using a lower voltage value for the reference signal $S_{REF}$ enables a simple circuit to be used to generate $S_{REF}$ from the approximately 3 V–5 V appearing between ports 201 and 202.

In general, the above-described conversion to a lower, more "workable" voltage range may be accomplished in a number of ways. For the reference signal $S_{REF}$, it is often easier to generate the lower voltage value directly using a stack of one or more diodes or a bandgap-reference circuit, both of which enable the generation of a number of possible reference voltage values. In a preferred embodiment of comparison means 220, the reference voltage signal $S_{REF}$ is generated as a substantially constant voltage by using the voltage drop across a rectifier 214 ($\sim 0.7$ V), as shown in FIG. 2. The current through rectifier 214 is controlled by a resistor 212, whose value is chosen according to conventional practice to provide sufficient bias current to rectifier 214 without unduly loading the power at first terminal 11.

For the varying signal appearing at port 201, the conversion to a lower, more workable voltage range may be accomplished by level shifting the signal with a level shifting circuit, such as a stack of series-connected diodes stacked above a resistor (and coupled thereto), or may be accomplished by scaling the signal with a voltage divider circuit, such as one comprising two series connected resistors. In a preferred embodiment of comparison means 220, the varying signal at port 201 is scaled by a sense/conversion means 230 to generate a scaled signal $V_{SEN}$ in proportion to the signal at port 201, and thus at first terminal 11. Sense/conversion means 230 preferably comprises a series combination of a first resistor 231 coupled in series with a second resistor 232 at a node 235, the series combination being coupled between ports 201 and 202. Sense/conversion means 230 functions as a voltage divider and provides the scaled voltage signal $V_{SEN}$ at node 235. The values of resistors 231 and 232 are set such that the ratio of $R_{232}/(R_{231}+R_{232})$ is approximately equal to 1/6 (0.165). With this ratio, $V_{SEN}$ has a value of ~0.825 volts when the potential across ports 201, 202 is 5 V and a value of ~0.575 when the potential across port 201, 202 is 3.5 V, thus bracketing the nominal 0.7 V of the reference signal $S_{REF}$ provided at node 215.

In this way, signal $V_{SEN}$ is converted (i.e., scaled) with respect to the ~0.7 V reference signal $S_{REF}$ such that it is less than $S_{REF}$ when the power signal is in its first (lower) power-level state and such that it is greater than $S_{REF}$ when the power signal is in its second (higher) power-level state. The value of resistors 231 and 232 are chosen according to conventional practice to provide sufficient current for voltage division without unduly loading down the power input at first terminal 11. Other voltage division circuits, such as series capacitor dividers or switched capacitor divider circuits may also be used.

For comparing $S_{REF}$ and the scaled voltage signal $V_{SEN}$, comparison means 220 preferably further comprises a comparator 240, such as a differential amplifier, having a first input 241 coupled to the voltage signal $V_{SEN}$, a second input 242 coupled to signal $S_{REF}$ (at node 215), and an output 244 for providing the second clock signal $CL_{INT}$ as a function of the difference of scaled voltage signal $V_{SEN}$ and the voltage level of signal $S_{REF}$. Comparator 240 is powered by the voltage difference between the voltage on port 201 and the voltage on ground port 202. Port 201 is coupled to a power port 245 on comparator 240 and ground port 202 is coupled to a ground port 246 thereon. In a preferred embodiment of comparison means 220, first input 241 is a non-inverting input, second input 242 is an inverting input, and output 244 provides a difference signal $S_{DIFF}$ as a function of the difference between the scaled voltage $V_{SEN}$ and the reference voltage signal $S_{REF}$. Preferably, difference signal $S_{DIFF}$ is a voltage which has a logic high voltage (> ~3 V) when $V_{SEN}$ is greater than $S_{REF}$ (i.e., when the modulated power signal is in its second, higher state) and has a logic low voltage (~0 V) when $V_{SEN}$ is less than $S_{REF}$ (i.e., when the modulated power signal is in its first, lower state). Difference signal $S_{DIFF}$ is provided as second clock signal $CL_{INT}$. In this manner, second clock signal $CL_{INT}$ is generated as a function of the difference of the signal at port 201 and the reference signal $S_{REF}$. Thus, in this embodiment of the present invention, second clock signal $CL_{INT}$ enters its first logic state substantially when clock signal $CL_{EXT}$ enters its first logic state and clock signal $CL_{INT}$ enters its second logic state substantially when clock signal $CL_{EXT}$ enters its second logic state. In this manner, the state transitions of second clock signal $CL_{INT}$ are a function of the state transitions of first clock signal $CL_{EXT}$.

It may be appreciated that, as an equivalent means to comparator 240, the polarity of inputs 241 and 242 of comparator 240 may be reversed and that an inverter may be added to the output of comparator 240. The reversing of polarities is compensated for by the added inverter, which may be formed as part of digital subsystem 30. It may also be appreciated that comparator 240 may further comprise a hysteresis means for reducing the effects of any noise signals which may be inadvertently coupled onto inputs 241 and 242. Such a hysteresis means may be, for example, implemented with Schmitt-trigger type circuits known to the digital circuit arts.

Finally, it may be appreciated in light of the present invention that although detection means 200 compares the modulated power signal at port 201 and the reference signal $S_{REF}$ in terms of voltages (i.e., under a voltage metric), a detection means may be constructed which compares the modulated power signal at first terminal 11 and the reference signal $S_{REF}$ in terms of currents (i.e., under a current metric). Such a detection means would include a means for generating a scaled current signal as a function of the modulated power signal on first terminal 11, a reference current generator for producing a constant reference current, and a current comparison means for comparing these two currents and generating the second clock signal $CL_{INT}$ as a function of their difference. Such a current comparison means may comprise, for example, a current summation junction having three branches connected thereto: the first branch for receiving the scaled current signal, the second branch for receiving the negative of the reference current, and the third for providing the difference of the first two branches. Thus, it may be appreciated that the present invention may be practiced with detection means employing either voltage or current metrics.

A description of an exemplary embodiment for detection means 20 and equivalents thereof has thus far been given. The discussion that follows now focuses on describing an exemplary embodiment for digital subsystem 30. As indicated above, digital subsystem 30 includes a serial communication means for exchanging data with the application system via the coordination of the clock signal (terminal 11, ports 24 and 34) and the data signal (terminal 13, port 33) with respect to one another. An exemplary communication means is discussed below with reference to an exemplary subsystem intended for memory storage applications, i.e., a serial memory device comprising RAM, NOVRAM, EEPROM, or EPROM, etc. However, as indicated above, the digital subsystem of the present invention may also provide other various capabilities, and means for these capabilities, depending upon the nature of peripheral device 10. For example, the digital subsystem may provide a variable programmable electrical element (e.g., variable resistor), a sensing capability (e.g., temperature, time, distance, speed, pressure etc.), or a controlling capability (e.g., positioner, flow-restrictor, etc.). Nonetheless, it may be appreciated that the serial communication means described below with reference to a memory-based digital subsystem is compatible with these other capabilities and that the communication means and subsystem of the present invention are not limited to such memory-based capabilities.

An exemplary subsystem suitable for providing means for storing data in peripheral device 10 according to the present invention comprises a memory unit 300, as shown in FIG. 3. Memory unit 300 comprises a power port 301 for receiving a source of power, a ground port 302 for receiving a fixed reference potential (e.g., ground), a data port 303 for receiving a serial data signal from the application system coupled to peripheral device 10 and for transmitting a serial data signal to the application system, and a clock port 304 for receiving a standard MOS or TTL logic level clock signal (e.g. $CL_{INT}$). Ports 301, 302, 303, and 304 of memory unit 300 correspond in function to ports 31, 32, 33, and 34 of digital subsystem 30, respectively, as shown in FIG. 1. As such, port 301 is coupled to first terminal 11 of peripheral device 10 (shown in FIG. 1), port 302 is coupled to second terminal 12 of peripheral device 10, data port 303 is coupled to data terminal 13 of peripheral device 10, and clock port 304 is coupled the clock output port 24 of detection means 20 for receiving the second clock signal $CL_{INT}$.

It may be appreciated that a detailed explanation of the operation of memory unit 300 is not necessary in order to understand the present invention and enable one of ordinary skill in the art to make and use the same. Thus, memory unit 300 is described at a level sufficient for one of ordinary skill in the art to understand and practice the present invention. Further and more detailed information on serial memory units similar to memory unit 300 may be found in the following 1990 reference, which is incorporated herein by reference, entitled: Technical Data Sheet for the "XICOR X24C01 Electrically Erasable PROM".

The components of memory unit 300 may be better understood and appreciated by first describing exemplary and preferred communications protocols used by memory unit 300. As mentioned above, the data signal at data port 301 (data terminal 13) and the second clock signal $CL_{EX}$ at clock port 304 are synchronized with respect to one another such that data in serial form is enabled to be communicated between memory unit 300 and the application system (i.e., such that data may written to and read from memory unit 300 by the application system). The communication protocol for reading and writing comprises a sequence of records, each record comprising an instruction segment indicating the type of operation (e.g. read, write), an address segment indicating the address of memory unit 300 to which the instruction applies, and a data segment representing the data to be read from or written to the address specified by the address segment. Optionally, each record may be preceded by a start-identification segment for identifying the beginning of the record and followed by an stop-identification segment for identifying the end of the record. The instruction and address segments are generally provided by the application system. The data segment is provided by the application system during write operations and provided by memory unit 300 during read operations.

In a preferred embodiment of memory unit 300, the address segment is provided before the instruction segment in each record, and the instruction segment is provided before the data segment in each record. For example, a protocol record for transmitting data to memory unit 300 from the application system comprises an address segment indicating the address to be written to, followed by an instruction segment indicating a write operation, followed by a data segment providing the data to be written to the address specified by the address segment. Each of these segments are provided by the application system. Likewise, a protocol record for requesting data from memory unit 300 preferably comprises an address segment indicating the address to be read from, followed by an instruction segment indicating a read operation, followed by a data segment providing the requested data from the address specified by the address segment. For the read record, the instruction and address segments are provided by the application system while the data segment is provided by memory unit 300.

In addition to the above described segments, a protocol record may comprise one or more acknowledgment segment in which memory unit 300 can indicate to the application system that it has properly received certain segments. In a preferred embodiment of memory unit 300, an acknowledgment segment is provided in each record after receiving the address and instruction segments. Additionally, an acknowledgment segment is provided in each write record after receiving the data segment.

It may be appreciated that the above-described communication protocol may be used by any digital subsystem 30. More specifically, records may be used to communicate instructions and data from the application system to subsystem 30 and may be used to transfer data from subsystem 30 to the application system. Further, the address segment may not be needed in certain versions of subsystem 30, e.g., where an environmental quantity, such as temperature, is sensed.

Each of the protocol record segments (start, address, instruction, acknowledge, data, and stop) comprises one or more transmission events, each transmission event providing a quantum digit of data. A transmission event is a predetermined sequence of logic states in the clock and data signals occurring over a predetermined time duration. At least two different predetermined sequences are required for communications, so as to provide distinguishable data digits. Examples of two different predetermined sequences are: (1) the data signal being in its logic high state during the time duration when the clock signal is its logic high state, and (2) the data signal making a logic state transition from its high state to its low state during the time duration when the clock signal is its logic high state.

A transmission event represents a quantum digit of data by the predetermined sequence it uses, each predetermined sequence representing a different digital value. For example, each quantum digit may comprise a binary digit in base 2 communicating one of two values, 0 and 1. To represent the binary quantum digit, a first predetermined sequence for representing a 0 value may comprise a logic low level on the data port 303 during the time the clock signal on port 304 is high, and a second predetermined sequence for representing a 1 value may comprise a logic high level on the data port 303 during the time the clock signal on port 304 is high.

Transmission events based on these predetermined sequences may be used by the address, instruction, acknowledge, and data segments. For representing a start segment in a binary quanta implementation, a predetermined digit sequence provided by a predetermined number of transmission events appearing after a predetermined "dead-time" may be used and detected by a start-stop unit 355. Additionally in a binary quanta implementation, a stop segment may comprise a second predetermined binary sequence appearing after a predetermined record length.

As another example of a quantum implementation, each quantum "digit" may comprise a quaternary digit in base 4 communicating one of four values: 0, 1, 2, and 3. Two of these values may be used to communicate data via two logic states (i.e., "0" and "1") and the other two values may be used to indicate the start and stop segments, respectively, instead of using predetermined binary sequences for this purpose. To represent the quaternary quanta values with transmission events, the following four predetermined sequences may be used:
1. a logic low level on the data port 303 during the time the clock signal on port 304 is high to represent value 0,
2. a logic high level on the data port 303 during the time the clock signal on port 304 is high to represent value 1,
3. a transition from a logic low level to a logic high level on the data port 303 during the time the clock signal on port 304 is high to represent value 2, and
4. a transition from a logic high level to a logic low level on the data port 303 during the time the clock signal on port 304 is high to represent value 3.

As indicated above, one of the four quaternary values may be allocated to uniquely represent the start segment, and a second of the four quaternary values may be allocated to uniquely represent the stop segment. The remaining two values may then be used to communicate data in the form of binary digits: "0" and "1".

By the above two examples, it may be appreciated that the data signal on port 303 and the clock signal on port 304 are synchronized with respect to one another during the transmission events to enable the communication of data between memory unit 300 and the application system. In a preferred embodiment of memory unit 300, the serial data signal on port 303 is synchronized to first clock signal $CL_{EX}$ during the transmission events by the application system when serial data is being received from the application system by memory unit 300 (e.g., during the address segment, instruction segment, and the data segment for a read operation). Additionally, the serial data signal on port 303 is synchronized to second clock signal $CL_{EX}$ during the transmission events by memory unit 300 when serial data is being transmitted to the application system by memory unit 300 (e.g., during the data segment for a write operation). Also in a preferred embodiment of memory unit 300, each of the protocol record segments comprises a predetermined number of transmission events. In the preferred embodiment of memory unit 300, each address segment comprises seven (7) events, each instruction event comprises one (1) event, each data segment comprises eight (8) events, each acknowledgment segment comprises one (1) event.

In the above-described transmission protocols, the clock signal is generally controlled by the application system with the control of the data signal being shared between the application system and memory 300 (or digital subsystem 30 shown in FIG. 1). The sharing of the control of the data signal is done such that the data line is not controlled by both the application system and memory unit 300 at the same time, i.e., such that there is no contention on the data line. The prevention of data contention is accomplished by separate means within each of the application system and memory unit 300 which monitor the requested instruction (e.g., read, write) and prevent data contention. For example, the application system is prevented from providing data on the data signal line during the data segment of a read operation and the memory unit is prevented from providing data on the data signal line during the data segment of a write operation.

In may be appreciated that the above-described transmission events and protocols may be used by any digital subsystem 30 as shown in FIG. 1. This is because the transmission events and protocols, which support the above-described record transmission protocol, may be used by any subsystem 30.

Having thus described the exemplary and preferred communication protocols at a level needed to understand and appreciated the components of memory unit 300, these components are now described in greater detail.

Memory unit 300 comprises a memory array 310 for storing data, a row decoder 320 and a column decoder 330 associated with array 310, a sequence control unit 340 for controlling read and write operations to memory unit 300, and a start-stop unit 355 for detecting the start and stop segments of protocol records. Memory unit 300 further comprises a word address register 360 for storing the address communicated to memory unit 300 during each address segment, a data register 370 for storing the data communicated between memory unit 300 and the application system during each data segment, and an output buffer control unit 380 and an associated drive transistor (FET) 385 for placing data onto data port 303. As discussed below in greater detail, start-stop unit 355 and control unit 340 are each directly coupled to clock port 304 and data port 303 and comprises means for determining and tracking the state of each protocol record during transmission. Word address register 360 and data register 370 are each directly coupled to data port 303, and each is selectively clocked by control unit 340 at appropriate times during each protocol record transmission, as required by the requested instruction. The operation of the above-listed components will be described in greater detail below, beginning with memory array 310, followed by start-stop unit 355, control unit 340, and the remaining components.

In a preferred embodiment of memory unit 300, memory array 310 comprises 1024 binary bits of data organized as 128 bytes, each byte having 8 bits. With this organization, seven (7) binary bits are sufficient to fully address the 128 bytes, hence the address segment in each protocol record is seven (7) bits wide. Memory array 310 is preferably organized as 32 rows (words) by 32 columns. The columns are further organized into four (4) column groups, each column group having 8 bits. Five (5) bits of the address segment, which are held in word register 360, are used to select one of the 32 rows. This selection is provided by row decoder 320, which receives five (5) address lines from word address register 360 and, in response thereto, selects one of the 32 rows lines, which uniquely corresponds to the value represented by the five (5) binary address lines. The remaining two (2) bits of the seven (7) address bits are used to select one of the 4 column groups. This selection is provided by column decoder 330, which receives two (2) address lines (bits) from word address register 360 and, in response thereto, selects one of the four (4) column groups which uniquely corresponds to the value represented by these two (2) address bits. The eight bits of selected column group in the selected row are thereby selected for reading or writing to data register 370, which preferably comprises eight corresponding data latches corresponding to the selected eight bits.

For exchanging data between the column groups of memory array 310 and the eight data latches of data register 370, column decoder 330 preferably comprises eight bi-directional multiplexers, one such multiplexer per data latch of data register 370. Each such multiplexer comprises four inputs which are selectively coupled to one output. The output of each multiplexer is coupled to a respective data latch of register 370. The four inputs of each multiplexer are coupled to a respective column in a respective column group (four inputs corresponding to four column groups). Further details of coupling each of the eight (8) bits in the selected column group to a respective bit-latch of data register 370 are discussed below in greater detail. The general organization of memory array 310, as well as the structure and functions of decoders 320 and 330, are well known to the semiconductor memory art and a detailed discussion thereof is not necessary for enabling one of ordinary skill in the art to practice the present invention.

Start-stop unit 355 is coupled to data port 303 and to clock port 304 and monitors the clock and data signal lines for the start and stop segments of each protocol record. As indicated above, for representing a start segment in binary quanta implementation, a predetermined digit sequence appearing after a predetermined "dead-time" may be used and detected by start-stop unit 355. Additionally in a binary quanta implementation, a stop segment may comprise a second predetermined binary sequence appearing after a predetermined record length. In this case, start-stop unit 355 comprises means for detected each of these predetermined patterns. For representing start and stop segments in a quaternary quanta implementation, as mentioned above, one of the four quaternary values may be allocated to uniquely represent the start segment, a second of the four quaternary values may be allocated to uniquely represent the stop segment, and the remaining two values may be used to communicate data in the form of binary digits: "0" and "1". In this implementation, start-stop unit 355 preferably comprises means for detecting the first and second of the uniquely allocated quaternary values and for generating and transmitting start and stop signals to control unit 340 indicating the start and stop, respectively, of each protocol record.

Control unit 340 is responsive to the start-stop unit and identifies and tracks the sequencing of the segments in each protocol record. Upon identifying each segment as it occurs, control unit 340 activates the appropriate components of memory unit 300 to either receive or transmit data. Control unit 340 further comprises means for detecting the instruction segment and for directing the reading or writing of data in memory array 310, as required by the detected instruction segment. As described in greater detail below, control unit 340 outputs a "LOAD" signal to word address register 360 so that the address segment is serially loaded into register 360 as the digits of the address segment are communicated serially on the data and clock signal lines (ports 303 and 304, respectively). Further, during the data segment, control unit 340 outputs a parallel load-transfer signal "PLOAD" and a clocking signal "CK" to serial data register 370, and a "GATE" signal to output buffer unit 380 so that data is appropriately transferred between data register 370 and data port 303, as directed by the instruction segment. Further, control unit 340 outputs an "ACK" signal to output buffer unit 380 for coupling an acknowledgment segment to data port 303. Additionally, control unit 340 outputs a read/write instruction signal "R/$\overline{W}$" to column decoder 330 to indicate the direction of data, either into or out of memory array 310.

Word address register 360 is responsive to the data signal at port 303 and the LOAD signal from the control unit 340 and is for receiving the address segment of each protocol record. Word address register 360 preferably comprises a shift register for storing an address word, which in a preferred embodiment is seven (7) binary digits (bits) wide. However, it may be appreciated that the present invention is not limited in scope to seven address bits. The shift register may conventionally comprise a plurality of serially coupled data latches which are clocked by the "LOAD" signal from control unit 340 during the transmission of the address segment. The input of the first data latch is coupled to data port 303. Each time the "LOAD" signal is pulsed, data is clocked forward one bit through the latches of the shift register, with data on data port 303 being entered into the first bit and data in the last bit being disposed of. During the address segment, the "LOAD" signal substantially follows the clock signal on port 304 in that the "LOAD" signal increments data through the serial register with each cycle of the clock signal on port 304. Once the address has been clocked into word address register 360 at the end of the address segment, control unit 340 issues a read/write command via the "R/$\overline{W}$" signal line, upon which word address register 360 transfers the appropriate bits of the address word contained therein to row decoder 320 and column decoder 330 for selecting the appropriate bits in memory array 310.

Data register 370 is responsive to the data signal at port 303 and to the "CK" signal from control unit 340 and is for communicating data between memory array 310 and data port 303 during the data segment of each protocol record. Data register 370 preferably comprises a shift register having an input port 371 coupled to data port 303 (data input line "DIN"), an output port 372 coupled to output buffer unit 380 (data output line "DOUT"), and a parallel-load input port 373 coupled to column decoder 330. The shift register preferably further comprises eight serially coupled data latches which are clocked by the "CK" signal at a port 374, which is provided by control unit 340 during the data segment. It may be appreciated that the present invention is not limited to a number of eight data latches. Additionally, the shift register preferably further comprises a parallel load enable port 375 which is coupled to and enabled by the "PLOAD" signal from control unit 340. Normally, the contents of data register 370 are provided to column decoder 330 via port 373, such as during write operations. However, when a parallel load signal "PLOAD" is provided on port 375, as during a read operation, the eight bits of data selected by column decoder 330 are loaded into the eight data latches, respectively, of data register 370. Thus, during a read operation, selected data at the outputs of column decoder 330 are first loaded in parallel into data register 370 at the beginning of the data segment. Once this data has been loaded, control unit 340 clocks the data in register 370 via the "CK" signal serially onto data port 303, via output buffer 380. During a write operation, data is first serially clocked into data register 370 from data port 303 during the data segment by control unit 340 via the "CK" signal. Once this data has been loaded into register 370, the data is coupled from data register 370 to column decoder 330, via parallel port 373, for writing onto the addressed memory location in memory array 310.

Output buffer unit 380 is responsive to control unit 340 via the "GATE" and "ACK" signals and to the output signal "DOUT" of data register 370, and is for outputting data and acknowledgement segments to data port 303 at appropriate times during each protocol record. Associated with output buffer unit 380 is a pull-down FET 385 which has a drain terminal coupled to data port 303, a source terminal coupled to ground via port 302, and a gate terminal coupled to the output of buffer unit 380. Pull-down FET 385, in conjunction with pull-up resistor 9 shown in FIG. 1, communicates data to the data signal line by selectively grounding data port 303 to ground port 302, as required by the specific communication protocol. When FET 385 is not turned-on by buffer 380, pull-up resistor 9 in FIG. 1 raises the potential of data port 303. In the preferred embodiment of memory unit 300, a logic zero is communicated from memory unit 300 to the data line (i.e., data terminal 13, data port 303) by FET 385 grounding data port 303 during the logic high portion of the clock signal present at port 304. A logic high is communicated to the data line by FET 385 isolating data port 303 from ground during the logic high portion of the clock signal at port 304 so that pull-up resistor 9 may raise the voltage on the data line to a logic high. During a read operation in the preferred embodiment of memory unit 300, FET 385 is set to either its grounding state or its isolating state, depending upon the logic state being communicated, before the clock signal at port 304 enters its logic high state. Further, FET 385 maintains its state throughout the duration of the clock's logic high state. Finally, the application system reads the data from the data line only during the logic high state of the clock signal (port 304). Hence, the bits of the data segment are communicated with a number of consecutive clock logic-high states equal to the number of bits in the data segment (e.g., eight).

During a write operation, control unit 340 instructs output buffer 380 via the "GATE" signal to disable transmission of data from data register 370 to data port 303. This prevents "data contention" between the application system and memory unit 300 and allows the application system to control the data being placed on the data signal line (port 303). During the data segment of a read operation, the application system allows memory unit 300 to control the logic state of the data signal line. At this point, control unit 340 instructs output buffer 380 via the "GATE" signal to enable transmission of data from data register 370 to data port 303 as it is being clocked out of data register 370. It may be appreciated that FET 385, in conjunction with pull-up resistor 9, effectively inverts the logic state of the data present at its gate terminal (e.g., data port 303 is grounded to logic zero when the gate of FET 385 is at logic high). Therefore, in order to preserve data integrity, output buffer unit 380 further comprises means for logically inverting the logic state of the data being provided to it by data register 370.

In addition to selectively coupling data from data register 370 to data port 303, output buffer unit 380 further comprises means for placing an acknowledgment segment onto data port 303 in response to a command from control unit 340 via the "ACK" signal line. In a preferred embodiment of memory unit 300, via the acknowledgment segment comprises a logic low signal at data port 303 during logic high portions of the clock signal at port 304, the acknowledgement segment being generated at predetermined times in the protocol record, as discussed above.

In the above described manner, memory unit 300 is able to serially communicate data to and from an application system. Memory array 310 may comprise a volatile memory means or, as in a preferred embodiment, may comprise a non-volatile memory means. Examples of such a non-volatile memory means may be found in U.S. Pat. No. 4,599,706 issued to Guterman, U.S. Pat. No. 4,486,769 to Simko, and U.S. Pat. No. 4,393,481 to Owen, et al. Such nonvolatile means may comprise floating gate devices and MNOS (Metal-Nitride-Oxide Semiconductor) devices. Such non-volatile memory means generally require a high voltage of 15 V–25 V for programming (writing) of data into the nonvolatile means of each memory cell. Such means may be provided on the same chip as the memory, for example, as taught in U.S. Pat. No. 4,326,134 to Owen, et al. For such non-volatile memory means, memory unit 310 would therefore include a high-voltage generation and timing control unit 390 shown in FIG. 3. This unit generates a high voltage from the $V_{cc}$ supply provided between ports 301 and 302 in response to a command from control unit 340 via the "START CYCLE" signal line. The high voltage is then coupled to non-volatile memory means in memory array 310 during write operations, as is well known in the non-volatile memory art.

It may be appreciated that the above-described record protocol, transmission protocol, control unit 340, registers 360 and 370, output buffer 380, output FET 385, and start-stop unit 355 collectively comprise the serial communication means for exchanging data between memory unit 300 and the application system via the coordination of the states and state-transitions of the clock and data signals. It may be further appreciated that the serial communication means described above with reference to memory unit 300 may be employed by other types of digital subsystems 30. As one example, when subsystem 30 is used to provide a temperature sensing capability, the temperature may be measured by a sensor, digitized by analog-to-digital conversion means, and coupled to data register 370, in place of memory array 310 and decoders 320 and 330. As another example, when subsystem 30 is used to provide a mechanical positioning capability, the desired position may be communicated to register 370 and coupled to an appropriate mechanical positioner means. In this regard, address register 360 could also be used to provide the desired position. Thus, it may be appreciated that the above described protocols and inventive elements have wide applicability in providing serial communications.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A three terminal peripheral device for use in an application system comprising:

a first terminal for receiving a modulated power signal including a source of power and a first clock signal, a second terminal for receiving a ground reference potential, and a third terminal for receiving a serial data signal from the application system, the first clock signal having first and second logic states and state transitions between its first and second logic states, said peripheral device being powered by the potential difference between said first terminal and said second terminal;

detection means coupled to said first terminal for generating from the modulated power signal a second clock signal at an output having first and second logic states and state transitions between its first and second logic states, the state transitions of said second clock signal being a function of the state transitions of the first clock signal; and a digital subsystem having a power port coupled to said first terminal for receiving power, a ground port coupled to said second terminal for coupling a ground reference potential, a data port coupled to said third terminal for receiving a serial data signal from the application system, and a clock port coupled to said output of said detection means for receiving said second clock signal, the data signal and the first clock signal being synchronized with respect to one another such that data in serial form is enabled to be communicated from the application system to said digital subsystem.

2. The peripheral device of claim 1 wherein said first logic state of said second clock signal comprises a voltage having a value substantially equal to zero and said second logic state of said second clock signal comprises a voltage greater than three volts.

3. The peripheral device of claim 1 wherein said detection means comprises a reference means for generating a reference signal, and a comparison means for generating said second clock signal as a function of the variation in the signal at said first terminal with respect to said reference signal.

4. The peripheral device of claim 3 wherein said reference signal comprises a voltage level and wherein said comparison means comprises:

means for sensing the voltage at said first terminal and for generating a scaled voltage signal in proportion to the voltage at said first terminal; and a comparator having a first input coupled to said scaled voltage signal, a second input coupled to said voltage level of said reference signal, and an output for providing said second clock signal as a function of the difference between said scaled voltage signal and said voltage level of said reference signal.

5. The peripheral device of claim 4 wherein said scaled voltage signal comprises a first voltage level and a second voltage level, said second voltage level being greater than said first voltage level; and said voltage level of said reference signal being greater than said first voltage level and less than said second voltage level.

6. The peripheral device of claim 4 wherein said means for sensing the voltage at said first terminal and for generating said scaled voltage signal comprises a series combination of a first resistor coupled in series with a second resistor at a node, said series combination coupled between said first terminal and said second terminal, said scaled voltage signal provided at said node.

7. The peripheral device of claim 4 wherein said comparator is powered by the potential difference between said first terminal and said second terminal.

8. The peripheral device of claim 3 wherein said reference means comprises a series combination of a resistor coupled in series with a rectifier at a node, said series combination coupled between said first terminal and said second terminal, said reference signal provided at said node.

9. The peripheral device of claim 1 wherein said third terminal is further for transmitting a serial data signal to the application system, said data port of said digital subsystem is further for transmitting a serial data signal to the application system, and wherein the data signal and the first clock signal are synchronized with respect to one another such that data in serial form is enabled to be communicated from said digital subsystem to the application system.

10. The peripheral device of claim 9 wherein said digital subsystem comprises a memory unit, and wherein the data signal and the first clock signal are synchronized with respect to one another by the application system and said memory unit such that data is written to and read from said memory unit via the data signal and the first clock signal.

11. The peripheral device of claim 10 wherein said memory unit comprises a non-volatile memory.

12. The peripheral device of claim 9 wherein the serial data signal is synchronized to the first clock signal by the application system when serial data is being received from the application system by said digital subsystem, and wherein the serial data signal is synchronized to the second clock signal by said digital subsystem when serial data is being transmitted to the application system by said digital subsystem.

13. The peripheral device of claim 1 wherein said second clock signal enters its said first logic state substantially when the first clock signal enters its first logic state, and wherein said second clock signal enters its said second logic state substantially when the first clock signal enters its second logic state.

14. A three terminal peripheral device for use in an application system comprising:

a first terminal for receiving a modulated power signal including a source of power and a first clock signal, a second terminal for receiving a ground reference potential, and a third terminal for transmitting a serial data signal to the application system, the first clock signal having first and second logic states and state transitions between its first and second logic states, said peripheral device being powered by the potential difference between said first terminal and said second terminal;

detection means coupled to said first terminal for generating from the modulated power signal a second clock signal at an output having first and second logic states and state transitions between its first and second logic states, the state transitions of said second clock signal being a function of the state transitions of the first clock signal; and a digital subsystem having a power port coupled to said first terminal for receiving power, a ground port coupled to said second terminal for coupling a ground reference potential, a data port coupled to said third terminal for transmitting a serial data signal to the application system, and a clock port coupled to said output of said detection means for receiving said second clock signal, the data signal and the first clock signal being synchronized with respect to one another such that data in serial form is enabled to be communicated from said digital subsystem to the application system.

15. The peripheral device of claim 14 wherein said detection means comprises a reference means for generating a reference signal, and a comparison means for generating said second clock signal as a function of the variation in the signal at said first terminal with respect to said reference signal.

16. The peripheral device of claim 15 wherein said reference signal comprises a voltage level and wherein said comparison means comprises:

means for sensing the voltage at said first terminal and for generating a scaled voltage signal in proportion to the voltage at said first terminal; and a comparator having a first input coupled to said scaled voltage signal, a second input coupled to said voltage level of said reference signal, and an output for providing said second clock signal as a function of the difference between said scaled voltage signal and said voltage level of said reference signal.

17. The peripheral device of claim 16 wherein said scaled voltage signal comprises a first voltage level and a second voltage level, said second voltage level being greater than said first voltage level; and said voltage level of said reference signal being greater than said first voltage level and less than said second voltage level.

18. The peripheral device of claim 16 wherein said means for sensing the voltage at said first terminal and for generating said scaled voltage signal comprises a series combination of a first resistor coupled in series with a second resistor at a node, said series combination coupled between said first terminal and said second terminal, said scaled voltage signal provided at said node.

* * * * *